United States Patent [19]

Bone

[11] Patent Number: 4,831,595

[45] Date of Patent: May 16, 1989

[54] LOW VOLTAGE POWER DOWN LOGIC CONTROL CIRCUIT

[75] Inventor: Robert L. Bone, Mission Viejo, Calif.

[73] Assignee: Hughes Aircraft Company, Los Angeles, Calif.

[21] Appl. No.: 47,085

[22] Filed: May 6, 1987

[51] Int. Cl.⁴ .............................. G11C 7/00
[52] U.S. Cl. .................................. 365/229
[58] Field of Search ......................... 365/229

[56] References Cited

U.S. PATENT DOCUMENTS

| | | | |
|---|---|---|---|
| 4,399,524 | 8/1983 | Maguruma et al. | 365/229 |
| 4,422,163 | 12/1983 | Oldenkamp | 365/229 |
| 4,580,248 | 4/1986 | Imaizumi | 365/229 |
| 4,611,302 | 9/1986 | Bockett-Pugh | 365/229 |

Primary Examiner—James W. Moffitt
Attorney, Agent, or Firm—Terje Gudmestad; Kenneth W. Float; A. W. Karambelas

[57] ABSTRACT

A power down logic control circuit employing a diode and a capacitor to develop a voltage from a main power supply which normally holds a transistor in an "off" state. Upon disconnection of the main supply, the transistor switches "on" and activates a second transistor. Upon activation, the second transistor produces an inhibit signal to tri-state memory control circuitry and thereby preserve the memory data during transition to standby memory power provided by a lithium battery.

16 Claims, 1 Drawing Sheet

LOW VOLTAGE POWER DOWN LOGIC CONTROL CIRCUIT

BACKGROUND OF THE INVENTION

1. Field of the Invention

The subject invention relates to memory circuitry and more particularly to a control circuit for controlling memory write logic and output states during disconnection of the memory from a plug-in power source.

2. Description of Related Art

In the prior art, circuitry for maintaining memory integrity in the face of power down procedures or power outages is known. Such circuitry typically employs power supply detect circuits or voltage comparators, which draw relatively large currents and consume relatively large amounts of power. Such circuitry also must have access to battery voltage to operate during power-up, power-down and battery hold time i.e. standby conditions. It is also not specifically designed for use in an environment where a memory is supplied with power through a plug-in connection which may be randomly disconnected.

The prior art circuitry is also relatively complex, employing, for example, flip-flop circuitry and/or operational amplifiers. In the case of CMOS operational amplifier circuitry, the circuitry ceases to function below 1.5 volts. Operation below this voltage level has appeared desirable to the inventor.

Thus, the prior art has not provided a number of capabilities which have appeared advantageous. The prior art has not provided a power down logic control circuit operable at very low voltages and which draws little or no current during battery hold time. The prior art has lacked a power down logic control circuit which will prevent memory loss and ensure proper control of logic levels when used in conjunction with a memory module which is subject to being disconnected at random times from the normal power supply without any prior power-down procedures. In particular, a low voltage power down circuit has not been available which will control logic levels and the transition to standby battery power where a plug-in memory module is randomly and manually pulled out of a plug-in power connection. Power down logic control circuitry which does not require access to battery voltage during power down and standby conditions also has not been available.

SUMMARY OF THE INVENTION

It is therefore a feature of the invention to improve circuitry for automatically controlling power down of memory circuitry.

It is another feature of the invention to provide a power down logic control circuit which is simple, draws little or no current, and operates at very low voltages, e.g. down to 0.8 volts.

It is another feature of the invention to provide a power down logic control circuit which does not require acess to battery power to operate during power down and battery hold or standby time.

It is another feature of the invention to provide a power down logic control circuit which can handle power down of a memory module when such a module is disconnected from its power supply without warning and without prior power down procedures.

It is another feature of the invention to provide a power down logic control circuit which preserves memory contents and which controls logic levels in a memory module which is manually unplugged from a cooperating power source.

It is yet another feature of the invention to provide a power down logic control circuit particularly adapted to control CMOS memory circuitry.

The foregoing and other features of the invention, together with attendent advantages are achieved by a power down logic control circuit including a voltage storage means to which a switching means is connected. The switching means responds to the disconnection of the main power supply to generate an inhibit signal to inhibit memory read/write operations. A standby power supply is additionally provided to supply standby power to the memory upon disconnection of the main power supply. By inhibiting read/write operations during power transition and supplying standby power, the memory data is preserved.

In the disclosed embodiment, the inhibit signal is used to tri-state memory and control logic outputs, which prevents latch up as power is reduced from the power supply voltage to a lower standby voltage level. Tri-stating also reduces the current level which is drawn by the memory control chips. The voltage storage means in the preferred embodiment is a diode and capacitor. The diode is connected to conduct current from the main power supply to the capacitor. The capacitor is connected to a first transistor, whose base is also connected to the main power supply level such that the first transistor is normally off. Upon removal of the main power supply, the capacitor voltage turns on the first transistor. A second transistor is then turned on by the first transistor to generate the inhibit signal.

It will be understood that the term "diode" is used generically herein to refer to devices which permit current flow in one direction and not the other. Well-known examples include Schottky diodes, PN junction diodes, and NPN or PNP transistors having their respective bases and collectors shorted. The particular application of such diodes in a preferred embodiment will be discussed in more detail below.

DETAILED DESCRIPTION

Figure 1:
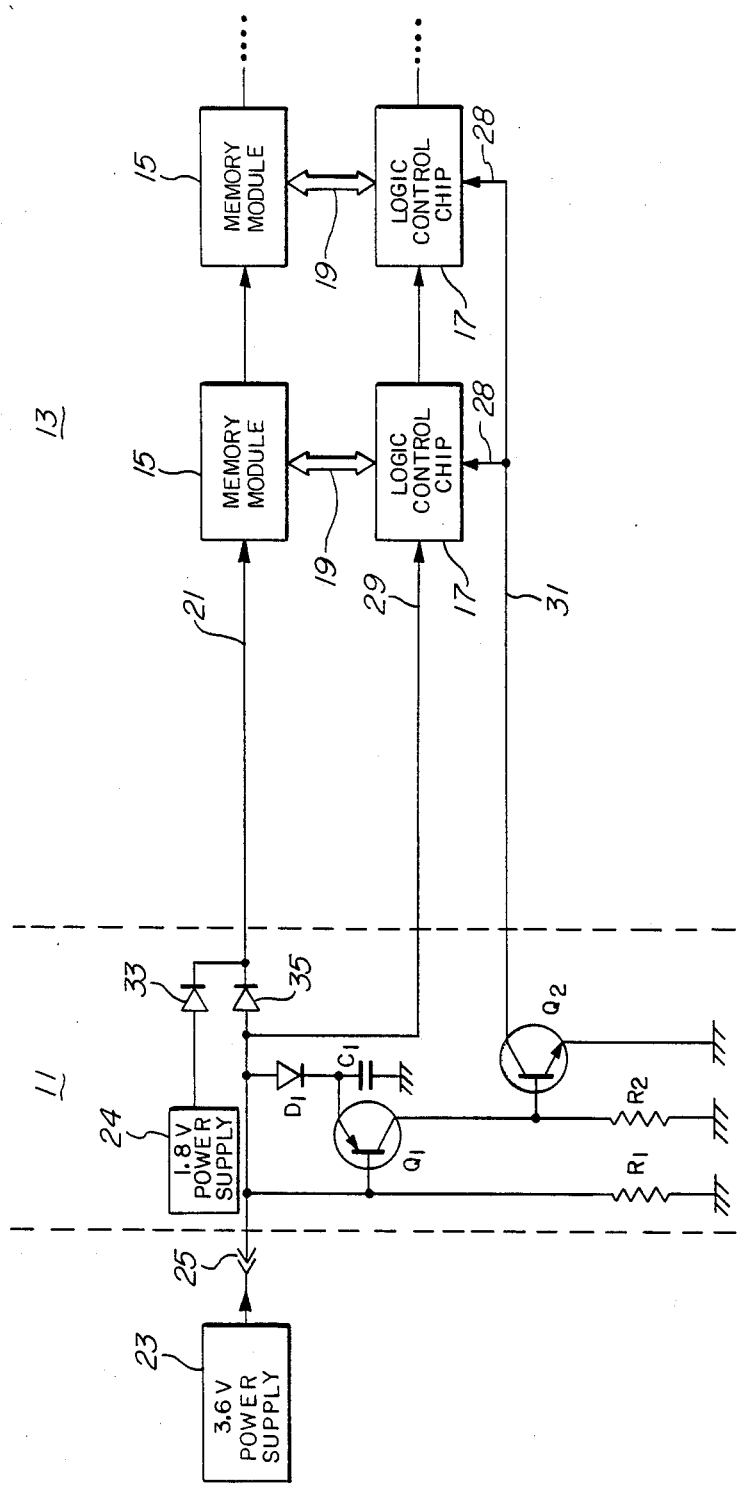
FIG. 1 is a circuit diagram illustrating a low voltage power down logic control circuit according to the preferred embodiment of the invention.

Referring to FIG. 1, a power down logic control circuit 11 is arranged to control a memory 13, which includes a plurality of memory storage modules 15 and a plurality of logic control chips 17. Each memory module 15 has a respective logic control chip 17 dedicated to it for purposes of controlling read/write operations. This read/write control is effected over a plurality of interconnections 19 between each module 15 and its associated logic control chip 17. Memory modules 15 and cooperating logic control chips 17 may be cascaded if desired to expand the memory.

During normal operation the memory modules 15 receive power over a line 21 from a power supply 23, which for illustrative purposes is shown as a 3.6 volt D.C. supply in the embodiment of FIG. 1. The 3.6 volt supply 23 connects through a power connector or plug 25 and a first diode 35 to the supply line 21.

Power is also supplied to the logic control chips 17 on a line 29. Additionally, a write control line 28 of each logic control chip 17 is connected to an inhibit line 31.

The power down logic control circuit of the present invention is particularly useful with a CMOS memory. With a CMOS memory, signal voltages must not exceed the supply voltages by more than 0.3 volts. Otherwise, a latch-up condition may occur in which excessive supply current will be drawn by the CMOS circuit. If not prevented, latch-up would result in rapid discharge of the standby/hold battery and possible damage to the CMOS circuitry.

Latch-up is particularly likely if power is withdrawn from the power pins of the logic control chips 17. In applying the preferred embodiment to CMOS circuitry, no standby power is supplied to the logic control/chips in the standby condition, and signal outputs are tri-stated during transition to zero power by an inhibit signal produced by the power down logic control circuit 11. Tri-starting of the signal outputs prevents the latch-up condition.

Accordingly, both sides of the control lines 19 are tri-stated by the inhibit signals supplied by the write control lines 28. The write control lines 28 are therefore connected to inhibit all outputs of the control chips 17 and all outputs coming from the memory modules 15. The detailed connection of the control lines 28 to tri-state each output of the control chips 17 and the memory modules 15 is straightforward and not illustrated in detail in FIG. 1. Schematically, the connections occur within the blocks labeled "memory module" and logic control chip in FIG. 1.

The power down logic control circuit 11 of the preferred embodiment includes a standby D.C. power supply 24. The standby voltage is illustrated as 1.8 volts, which is preferably provided by a long life lithium battery. The 1.8 volt power supply 24 is connected to the power line 21 through a second diode 33. The first diode 35 has its cathode connected to the cathode of the second diode 33 and hence to the power line 21. The power control line 29 to the memory logic chips 17 is connected to the anode side of the first diode 35, as is the power connector 25 and the remaining elements of the power down logic control circuit 11.

These remaining elements include a diode $D_1$, a bipolar PNP transistor $Q_1$, a bipolar NPN transistor $Q_2$, first and second resistors $R_1$, $R_2$ and a capacitor $C_1$. The anode of the diode $D_1$ is connected to the 3.6 volt supply line, while the cathode of the diode $D_1$ is connected to the emitter of the PNP bipolar transistor $Q_1$. The base of the PNP transistor $Q_1$ is connected to the 3.6 volt supply line and to one terminal of the first resistor $R_1$, whose opposite terminal is connected to ground.

The collector of the PNP transistor $Q_1$ is connected to the base of the second NPN bipolar transistor $Q_2$ and to one terminal of a second resistor $R_2$. The opposite terminal of the second resistor $R_2$ is also connected to ground. The collector of the second transistor $Q_2$ is connected to the inhibit line 31, while its emitter is connected to ground.

Finally, a capacitor $C_1$ is connected to the cathode of the diode $D_1$ at one terminal. The other terminal of the capacitor $C_1$ is connected to ground.

In operation of the circuit of FIG. 1, when the main 3.6 volt supply 23 is connected, the first and second transistors $Q_1$, $Q_2$ are in the "off" state and the capacitor $C_1$ is charged to approximately 3.0 volts. If the 3.6 volt supply 23 slowly drifts over time, or if the 3.6 volt level varies from one supply to another as different supplies are used, the circuit will not false trigger because the capacitor $C_1$ will always maintain a voltage level which is approximately 0.6 volts less than the main supply 23. The voltage on the capacitor $C_1$ will always maintain the first transistor $Q_1$ in the "off" state.

When the circuit 11 is unplugged from the power connector 25, the 3.6 volt supply on the base of the first transistor $Q_1$ and on control line 29 will fall almost instantaneously to approximately 0.0 volts. Power to the memory modules 15 continues to be supplied over the line 21 by the 1.8 volt source 24, which preserves the memory data.

When the base of the first transistor $Q_1$ falls to zero, the first transistor $Q_1$ will turn on and remain turned on until the voltage at its base-emitter junction reaches approximately 0.6 volts. The second transistor $Q_2$ will also turn on concurrently with the turn-on of the first transistor $Q_1$. When the second transistor $Q_2$ turns on, it inhibits the logic control chips 17 via the inhibit line 31. The voltage on the capacitor $C_1$ maintains a voltage on the emitter of transistor $Q_2$ which maintains the second transistor $Q_2$ in the "on" state. The capacitor $C_1$ begins to discharge through the second resistor $R_2$. The diode $D_1$ prevents the capacitor $C_1$ from discharging other than through the first transistor $Q_1$.

When the base-emitter junction of the first transistor $Q_1$ reaches approximatey 0.6 volts, the second transistor $Q_2$ will "go soft", i.e. reduce resistance slowly. The time constant of the circuit is set such that the base-emitter junction of the first transistor $Q_1$ does not reach 0.6 volts until greater than five milliseconds have elapsed and the memory control logic 17 and output signals are in a stable state. The second transistor $Q_2$ also comes on and supplies the inhibit signal before the voltage powering the logic control chips 17 falls on line 29. Thus, all the extraneous logic control states will have occurred while the memory was inhibited and while the output states of the memory 15 were held in tri-state.

Several design considerations may be noted. The value of the second resistor $R_2$ should preferably be selected so that the high temperature leakage currents of the first transistor $Q_1$ will not turn on the second transistor $Q_2$. The second resistor $R_2$ may thus be selected in the range 1 meg $\Omega$ to 10 meg $\Omega$.

The value of the first resistor $R_1$ (i.e. the total $R_1$ value) is: $(R_1 C_z)/(R_1+C_z)$. This equation reflects the fact that the base of the first transistor $Q_1$ "sees" the first resistor $R_1$ in parallel with the control chip impedance to ground $C_z$, i.e. the impedance from the power line 29 to ground with the 3.6 volt supply removed. Hence the first resistor $R_1$ can be a large resistance such as one megaohm so as to conserve power. The value of the first resistor $R_1$ will determine the turn-on time of the first transistor $Q_1$ and the second transistor $Q_2$. The value of the first resistor $R_1$ may be selected in the range 10k $\Omega$ to 10 meg $\Omega$, with a large value, such as one megaohm, being preferred.

The value of the capacitor $C_1$ will control the time constant which determines the "on" time of the second transistor $Q_2$. This is the time required to allow the memory logic control circuitry of the logic control chips 17 to become stable after the 3.6 volt power supply is unplugged.

An exemplary working breadboard model of the power down logic control circuit of FIG. 1 has been built and tested using the following components:

| Component | Part No./Value |
| --- | --- |
| $Q_1$ | 2N2907 |
| $Q_2$ | 2N2222 |
| $R_1$ | 10k Ω |
| $R_2$ | 10k Ω |
| $C_1$ | 10 μf |
| $D_1$ | 1N914 |
| 33 | 1N4001 |
| 35 | 1N4001 |

In this circuit, the base-emitter junction of the first transistor $Q_1$ does not reach 0.6 volts until about 12 milliseconds after disconnection of the power supply 23. With respect to the diodes 33, 35, a Schottky diode may be substituted if a lower forward voltage (0.3 volts) is desired. However, a Schottky diode is generally undesirable as a substitute for the diodes 33, 35 because of its considerable reverse leakage. Transistors with shorted base-collector junctions may also be used for the diodes 33, 35.

It should be noted that the first and second transistors $Q_1$, $Q_2$ may be enhancement (0.0 volt cutoff) FETS or MOSFETS instead of the bipolar transistors shown in FIG. 1. A design using MOSFETS can be designed into a VLSI memory logic control chip in a VLSI embodiment.

The foregoing description is directed to a particular embodiment of a low voltage power down logic control circuit which has the advantages of reliability, simplicity, and operation at low voltages and currents. Operation down to 0.8 volts is provided by the first transistor $Q_1$, well below the 1.5 volt threshold available with typical operational amplifiers. Operation at currents on the order of one microamp can also be achieved by the circuit of the preferred embodiment, depending on the value selected for the first resistor $R_1$.

It will be appreciated that the power down control circuit of the invention is designed to maintain power to memory storage over a power supply line and to provide a write inhibit signal for inhibiting writing into memory during transition to a standby power supply. Many known memory devices can be adapted to such control and have appropriate power lines and inhibitable or tri-statable control lines which are readily adaptable for use with the invention, as is well known to those skilled in the art. In particular, commercially available CMOS memory circuits adaptable for use with the invention are available.

It will be further understood that variations in component values and other design features as well as various adaptations of the circuit disclosed above will be readily apparent to those skilled in the art in order to meet various design requirements. Therefore, it is to be understood that, within the scope of the appended claims, the invention may be practiced other than as specifically described herein.

What is claimed is:

1. A control circuit for providing standby power to a memory circuit where primary power applied to said memory circuit is interrupted, said primary power being supplied by a primary power supply which supplies a primary voltage to said memory said control circuit, comprising:

standby power supply means coupled to said memory circuit for providing standby power to said memory circuit while primary power is interrupted to preserve information stored in said memory circuit;

voltage storage means coupled to said primary power for storing a voltage derived from said primary power supply; and a first transistor having a base, emitter and collector, said emitter being connected to said voltage storage means, said base being connected to said primary power source; and a second transistor having a base, emitter and collector, said base being connected to the collector of said second transistor, said emitter being connected to ground, and said output signal for interrupting the reading and writing operations in said memory circuit while said primary power is interrupted.

2. The control circuit of claim 1 wherein said first transistor comprises a NPN bipolar transistor.

3. The control circuit of claim 1 wherein said second transistor comprises a PNP bipolar transistor.

4. A circuit for a memory coupled by way of power line to a primary power source which supplies a source voltage, and to a standby power supply for providing a standby voltage to said memory when the source voltage is interrupted, said circuit comprising:

charge storage means coupled to said power source for storing a voltage derived from said power source, said charge storage means having a diode means and capacitor means connected together at a junction and between said power line and a ground voltage; and switch means connected to said charge storage means, said power line, and said memory for responding to a change in the difference between the source voltage and the voltage stored in said charge storage means to generate an inhibit signal for provision to said memory.

5. The control circuit of claim 4 wherein said power source and standby power supply are direct current (D.C.) supplies.

6. The control circuit of claim 4 wherein said means for generating an inhibit signal includes first switch means for responding to the disconnection of said power source and a second switch means for generating said inhibit signal, said first switch means includes a transistor having its emitter connected to said junction.

7. The control circuit of claim 6 wherein said second switch means comprises a second transistor having its base connected to the collector of said first transistor.

8. The control circuit of claim 7 wherein said standby voltage is connected to said power line by means of a diode.

9. The control circuit of claim 7 further including a first resistance connected from the base of said first transistor to ground.

10. The control circuit of claim 9 further including a second resistance connected from the base of said second transistor to ground.

11. The control circuit of claim 10 wherein said inhibit signal is generating at the collector of said second transistor.

12. A circuit for controlling a memory circuit during disconnection of a main power supply coupled to said memory circuit, the memory circuit comprising a memory, a logic control circuit, first and second power supply lines coupled to said memory and logic control circuit, respectively, and a plurality of inhibit lines, the first and second power supply lines being normally supplied with power from the main power supply, said circuit comprising:

standby power supply means for supplying standby power to said first power supply line upon occurrence of said disconnection; and switch means responsive to said disconnection of said main power supply for generating an inhibit signal on said inhibit lines for a selected time interval after said disconnection, said switch means comprising:

storage means for storing a voltage while said main power supply is connected said first and second supply lines;

a first transistor having its emitter connected to said storage means and its base connected to said main power supply; and a second transistor having its base connected to the collector of said first transistor and its collector to said inhibit line said transistors maintaining an "off" state in response to the voltage stored by said storage means and for turning on and supplying said inhibit signal in response to said disconnection of said main power supply.

13. The power down logic control circuit of claim 12 wherein said storage means for developing and holding a voltage comprises:

a diode having an anode connected to said main power supply and a cathode; and a capacitor means having a terminal connected to the emitter of said first transistor and to the cathode of said diode.

14. A circuit for providing standby power to a memory circuit when primary power applied to said memory circuit is interrupted, said circuit comprising:

standby power supply means coupled to said memory circuit for providing standby power to said memory circuit while primary power is interrupted to preserve information stored in said memory circuit;

voltage storage means coupled to said primary power supply for storing a voltage derived from said primary power supply; and switching means coupled to said voltage storage means, said primary power supply and said memory circuit, for sensing the interruption of primary power supplied by said primary power supply and inhibiting reading and writing operations to said memory circuit while said primary power is interrupted, said switching means comprising:

first transistor means having a base, emitter and collector, said emitter being connected to said voltage storage means, said base being connected to said primary power source; and second transistor means having a base, emitter and collector, said base being connected to the collector of said first transistor means, said emitter being connected to ground, and said collector being connected to said memory circuit, for providing an output signal which interrupts the reading and writing operations to said memory circuit while said primary power is interrupted.

15. A circuit for interconnecting a memory to a power source which supplies a source voltage, said circuit comprising:

a power line connectable to said power source;

a standby voltage supply connected to said power line;

charge storage means having a first terminal coupled to said power line for storing a voltage derived from said power source, said charge storage means having a second terminal connected to ground voltage; and switch means connected to said charge storage means, to said power line and to said memory for responding to a change in the difference between the source voltage and the voltage stored in said charge storage means and for generating an inhibit signal which is provided to said memory, said switch means including first switch means for responding to the disconnection of said power source and second switch means for generating said inhibit signal.

16. A power-down circuit for controlling a memory circuit during disconnection of a main power supply coupled to said memory circuit, the memory circuit comprising a memory and a logic control circuit and having first and second power supply lines coupled to said memory and logic control circuit, respectively, and a plurality of inhibit lines, the first and second power supply lines being normally supplied with power from the main power supply, said circuit comprising:

standby power supply means for supplying standby power to said memory by way of said first power supply line upon occurrence of said disconnection of said main power supply; and switch means responsive to said disconnection of said main power supply for generating an inhibit signal on said inhibit lines for a selected time interval after said disconnection, said switch means comprising:

first transistor means having a base, emitter and collector, said emitter being connected to said first power supply line; and second transistor means having a base, emitter and collector, said base being connected to the collector of said first transistor means, and said collector being connected to said inhibit lines.

* * * * *